(12) United States Patent
Nagai et al.

(10) Patent No.: US 10,875,114 B2
(45) Date of Patent: Dec. 29, 2020

(54) VAPOR-PHASE TYPE HEATING METHOD AND VAPOR-PHASE TYPE HEATING APPARATUS

(71) Applicant: Panasonic Intellectual Property Management Co., Ltd., Osaka (JP)

(72) Inventors: Koichi Nagai, Kyoto (JP); Naofumi Hino, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 117 days.

(21) Appl. No.: 16/274,183

(22) Filed: Feb. 12, 2019

(65) Prior Publication Data
US 2019/0314917 A1    Oct. 17, 2019

(30) Foreign Application Priority Data

Apr. 16, 2018   (JP) ................................ 2018-078274

(51) Int. Cl.
| | |
|---|---|
| *B23K 1/015* | (2006.01) |
| *B23K 1/008* | (2006.01) |
| *H05K 3/34* | (2006.01) |
| *B23K 101/42* | (2006.01) |

(52) U.S. Cl.
CPC ............. *B23K 1/015* (2013.01); *B23K 1/008* (2013.01); *H05K 3/3494* (2013.01); *B23K 2101/42* (2018.08)

(58) Field of Classification Search
CPC ..................................................... B23K 1/015
See application file for complete search history.

(56) References Cited

U.S. PATENT DOCUMENTS

| | | | | |
|---|---|---|---|---|
| 4,321,031 A | * | 3/1982 | Woodgate | B23K 1/015 219/388 |
| 4,392,049 A | * | 7/1983 | Bentley | B23K 1/015 126/369 |
| 4,698,915 A | * | 10/1987 | Dickinson | B23K 1/015 134/11 |
| 4,726,506 A | * | 2/1988 | Kondo | B23K 1/085 228/37 |

(Continued)

FOREIGN PATENT DOCUMENTS

| | | |
|---|---|---|
| JP | 2-080168 | 3/1990 |
| JP | 2-112871 | 4/1990 |

(Continued)

*Primary Examiner* — Nathaniel Herzfeld

(74) *Attorney, Agent, or Firm* — Wenderoth, Lind & Ponack, L.L.P.

(57) ABSTRACT

In a vapor-phase type heating method, an object is heated by a heated gas containing vapor in a heating furnace. The heat transfer fluid falling from a front surface of the object to a lower portion of the heating furnace is collected, after the vapor comes into contact with the object and cools to liquefy and latent heat of vaporization of the vapor is applied to the object through phase change. The heated gas obtained after heating the object is discharged from an inside of the heating furnace to the circulation route. In the circulation route, the heat transfer fluid is supplied as droplets to the discharged heated gas and is vaporized after heating, and the heated gas including the vapor is supplied to the heating furnace.

4 Claims, 7 Drawing Sheets

(56) References Cited

U.S. PATENT DOCUMENTS

| | | | | |
|---|---|---|---|---|
| 4,762,264 | A * | 8/1988 | Peck | B23K 1/015 228/180.1 |
| 5,038,496 | A * | 8/1991 | Mishina | B23K 1/015 34/231 |
| 6,248,282 | B1 * | 6/2001 | Garidel | B23K 1/015 264/347 |
| 6,693,263 | B2 | 2/2004 | Nishimura | |
| 7,380,699 | B2 * | 6/2008 | Dokkedahl | B23K 1/015 228/219 |
| 2001/0030386 | A1 | 10/2001 | Garidel | |
| 2003/0111459 | A1 | 6/2003 | Nishimura | |
| 2009/0282973 | A1 * | 11/2009 | Nakamura | B23K 1/012 95/39 |
| 2011/0248074 | A1 * | 10/2011 | Davies | B23K 1/008 228/256 |
| 2013/0200136 | A1 | 8/2013 | Besshi et al. | |

FOREIGN PATENT DOCUMENTS

| | | |
|---|---|---|
| JP | 2001-047223 | 2/2001 |
| JP | 2003-225761 | 8/2003 |
| WO | 2012/070264 | 5/2012 |

* cited by examiner

VAPOR-PHASE TYPE HEATING METHOD AND VAPOR-PHASE TYPE HEATING APPARATUS

BACKGROUND

1. Technical Field

The present disclosure relates to a vapor-phase type heating method and a vapor-phase type heating apparatus for heating an object by using latent heat of vaporization of vapor from a heat transfer fluid.

2. Description of the Related Art

In recent years, in an assembly manufacturing process of various industrial products or home electronics or a device manufacturing process of an electronic component which becomes a configurational component of the industrial product or the home electronics, a battery, a board on which the electronic component is mounted, or the like, a shape of an object, which is processed by a heat treatment apparatus is complicated. For example, in the board on which the electronic component is mounted, in a state in which a holding force is weak to the extent that solder paste is applied so as to dispose the electronic component not only on a flat board but also on a portion other than a horizontal surface of a three-dimensional board, a heat treatment for melting the solder paste and performing bonding is performed. In addition, the board has a three-dimensional shape, and thereby heat capacity of the object also tends to increase. Here, examples of the heat treatment apparatus include a drying furnace, a cure furnace, a reflow furnace that is used for soldering in a mounting process or the like of an electronic component, or the like.

In a case where there is a variation in temperature rise at positions of the object due to uneven heating performance in a heating process of the objects, it is necessary to further hold the object for a desired period of time from a state in which all of the portions of the object reach a desired temperature in order to secure a desired necessary period of time for the heating process. In order to hold a portion, of which the temperature rise is slow, for a desired period of time, a portion, of which the temperature rise is rapid, is exposed to more heat than necessary. In this case, particularly in a case where heat has a significant influence, there is a concern about an influence on a quality. In addition, in a case of a heating process using heat transfer due to collision of hot air, and a case where the object has a high heat capacity, a collision speed of the hot air to the object is increased in order to obtain a desired rate of temperature rise, and thereby it is possible to increase a heat-transfer coefficient. However, in a case where it is necessary to perform the heating treatment in a state in which the holding force is weak to the extent that the solder paste is applied so as to dispose the electronic component on the portion other than the horizontal surface of the three-dimensional board, for example, the collision of the hot air is performed at a high speed before solidification of the solder is completed through melting and then cooling of the solder, and thereby there is a high possibility that the component is likely to peel off from the board. In this respect, there has been studied a method of avoiding the peeling off or the like of the components due to the collision of the hot air even on a board having a large heat capacity and efficiently heating the object by using a high heat-transfer coefficient. For example, as a method of heating an object by using latent heat of vaporization of vapor of a heat transfer fluid, and as a method of randomly setting a rate of temperature rise of an object, there has been known a method disclosed in Japanese Patent Unexamined Publication No. 2-112871.

FIG. 10 is a diagram illustrating a vapor-phase type soldering apparatus in the related art disclosed in Japanese Patent Unexamined Publication No. 2-112871. Japanese Patent Unexamined Publication No. 2-112871 discloses the following configuration. The vapor-phase type soldering apparatus in the related art includes container 101, heater 103, condenser 104, loading mechanism 107, and control mechanism 108.

Container 101 has an opening on an upper portion thereof. Heat transfer fluid 102 is stored in fluid portion 101b in a lower portion of container 101. Heater 103 is provided in fluid portion 101b in the lower portion of container 101 and heats heat transfer fluid 102. Condenser 104 is provided to have a predetermined interval from a top surface of heat transfer fluid 102. Saturated vapor 105 of heat transfer fluid 102 is formed between the top surface of heat transfer fluid 102 and condenser 104. Loading mechanism 107 loads object 106 from the opening and puts the object into saturated vapor 105. Control mechanism 108 performs control such that object 106 is put into the saturated vapor at a speed of lower than 15 mm/sec in a range in which a temperature of object 106 exceeds 70° C. and rises in a range of 100° C. to 150° C. Here, in the vapor-phase type soldering apparatus in the related art, fluid portion 101b of heat transfer fluid 102 is formed in a bottom portion of vapor tank 101a, heat transfer fluid 102 accommodated in fluid portion 101b is heated by heater 103, thereby vaporizing, and saturated vapor 105 is formed at the temperature described above on fluid portion 101b. Object 106 such as an electronic circuit board on which electronic components are mounted on the substrate via solder paste is immersed in saturated vapor 105 so as to come into contact with vapor of saturated vapor 105. Consequently, saturated vapor 105, of which a temperature decreases, liquefies to heat transfer fluid 102 and, at this time, latent heat of vaporization of saturated vapor 105 is applied to object 106 so as to heat the board. The temperature of object 106 reaches a soldering temperature due to the heating, and thereby the solder melts and soldering is completed after cooling. At this time, when object 106 is put into saturated vapor 105 at once, a heat-transfer coefficient becomes very high due to the latent heat of vaporization, and thus a rate of temperature rise is often too high due to a heat capacity of object 106. Therefore, in the configuration disclosed in Japanese Patent Unexamined Publication No. 2-112871, in order to realize a desired rate of temperature rise, while the temperature of object 106 is measured, and a putting-in speed is adjusted, the object is put into saturated vapor 105 such that the desired rate of temperature rise is obtained. Finally entire object 106 is immersed into saturated vapor 105, and thereby object 106 is heated until the temperature of the object reaches a boiling point of heat transfer fluid 102.

In addition, there has been known a method disclosed in Japanese Patent Unexamined Publication No. 2-80168 as a method for obtaining an even concentration of saturated vapor 105 of a heat transfer fluid. FIG. 11 is a diagram illustrating Japanese Patent Unexamined Publication No. 2-80168. Japanese Patent Unexamined Publication No. 2-80168 discloses the following configuration. Base 111, on which an article is disposed, is disposed in vapor 113 of inert fluid 112 having a boiling point equal to or higher than a melting temperature of a welding agent for welding the article and base 111. In this manner, in a vapor-phase type welding apparatus that heats and melts the welding agent by using latent heat of vaporization of vapor 113 and welds the article and base 111, agitation device 114, which generates a moderate convection flow to the extent that vapor 113 is not broken, is provided in vapor 113. When the configuration disclosed in Japanese Patent Unexamined Publication No. 2-80168 is employed, it is possible to cause vapor 113 to come into substantially even contact with base 111 and the article as an object having a height in a direction perpendicular to a fluid surface of inert fluid 112.

SUMMARY

A vapor-phase type heating method of the disclosure is for supplying vapor of a heat transfer fluid to a heating furnace and heating an object by using latent heat of vaporization of the supplied vapor, the method including:

heating the object with a heated gas containing the vapor of the heat transfer fluid in the heating furnace;

collecting the heat transfer fluid falling from a front surface of the object to a lower portion of the heating furnace, after the vapor comes into contact with the object and cools to liquefy, and latent heat of vaporization of the vapor is applied to the object through phase change;

discharging the heated gas after heating the object from the heating furnace to circulation route;

supplying the heat transfer fluid as droplets in the circulation route to an upstream side from a heat source that heats the heated gas;

heating the droplets so as to be changed into vapor and supplying the heated gas containing the vapor from the circulation route again to the heating furnace; and maintaining a predetermined amount of the vapor of the heat transfer fluid in the heating furnace by the collecting and the supplying and heating the object which is disposed in the heating furnace at a predetermined rate of temperature rise in a state of an even distribution of the vapor of the heat transfer fluid in the heating furnace.

A vapor-phase type heating apparatus of the disclosure includes:

a heating furnace that holds an object inside and causes heated gas containing vapor of heat transfer fluid to come into contact with the object such that the object is heated by using latent heat of vaporization of the vapor;

a circulation route that discharges the heated gas after heating the object from the heating furnace and supplies the heated gas again to the heating furnace;

a blower that is disposed on the circulation route and sends the heated gas toward the heating furnace;

a supply device that is disposed on the circulation route and supplies the heat transfer fluid as droplets into the circulation route;

a heating device that is disposed on a downstream side from the supply device on the circulation route, heats the heated gas discharged after heating the object from the heating furnace, and heats the droplets of the heat transfer fluid supplied from the supply device so as to change the droplets into vapor of the heat transfer fluid;

a collecting device that collects the heat transfer fluid in the heating furnace;

a controller that controls each of the supply device and the collecting device of the heat transfer fluid and controls a supply amount and a collecting amount of the vapor of the heat transfer fluid with respect to the circulation route so as to adjust the vapor in the heating furnace to a predetermined amount;

a spray member that is disposed around the object in the heating furnace and performs substantially evenly blow of the heated gas in the heating furnace to the object; and a re-heating device that is disposed below the heating furnace and re-heats the heat transfer fluid, which liquefies on a front surface of the object and falls down as droplets to a side below the object, such that the heat transfer fluid is changed into vapor.

DETAILED DESCRIPTION

In a configuration disclosed in Japanese Patent Unexamined Publication No. 2-112871, a variation in temperature of an object is limited in a case in which a board is configured to have a substantially flat surface in a horizontal direction with respect to a fluid surface, similarly to a general electronic circuit board. However, in a case where the object has a height in a perpendicular direction to the fluid surface, there is a difference in heating performance due to an influence by a difference in concentration and a difference in temperature of vapor in a height direction. Therefore, a difference in temperature rise occurs at positions of the object, particularly, in the perpendicular direction to the fluid surface, and a variation in temperature occurs in some cases.

In addition, in a configuration disclosed in Japanese Patent Unexamined Publication No. 2-80168, it is possible to expect an effect of maintaining a constant vapor concentration in a height direction in vapor in order to obtain an even vapor concentration of a heat transfer fluid by an agitating device. However, since the vapor concentration is constant and it is not possible to increase and decrease the vapor concentration, it is not possible to adjust a rate of temperature rise of an object put into the vapor to a desired rate of temperature rise.

Hereinafter, an exemplary embodiment of the disclosure will be described with reference to the drawings.

Exemplary Embodiment

Figure 1:
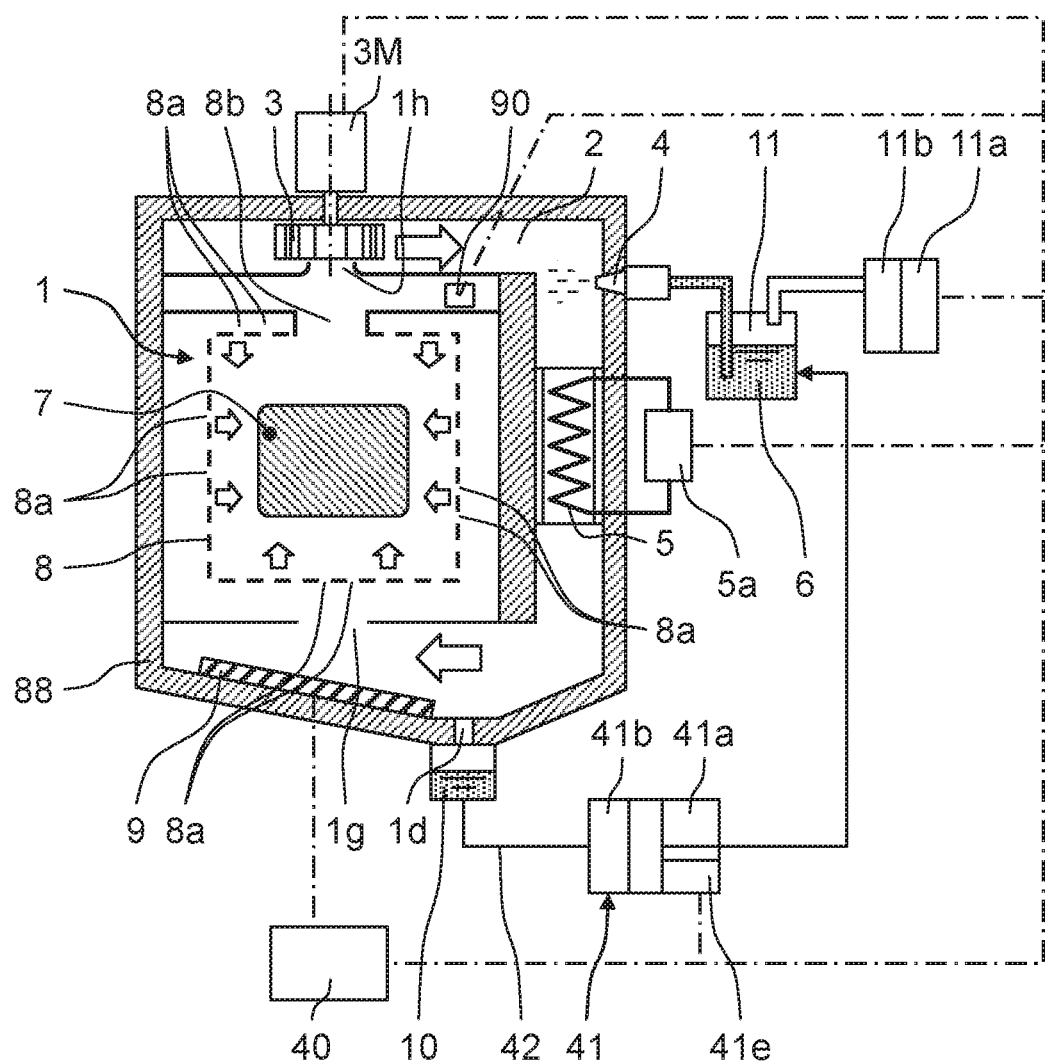
FIG. 1 is a diagram illustrating a vapor-phase type heating apparatus that performs a vapor-phase type heating method in an exemplary embodiment.

FIG. 1 is a diagram illustrating a vapor-phase type heating method in an exemplary embodiment. A vapor-phase type heating apparatus that is capable of performing the vapor-phase type heating method includes heating furnace 1, circulation duct 2, circulation fan 3, heat transfer fluid feeder 4, heat transfer fluid tank 11, and heat transfer fluid supply source 11b.

Heating furnace 1 is disposed in vapor-phase type heating apparatus casing 88 and performs a heating treatment of object 7.

Circulation duct 2 is disposed in vapor-phase type heating apparatus casing 88 and communicates with heating furnace 1 so as to circulate a heated gas in heating furnace 1. Circulation duct 2 functions as an example of a circulation route.

Circulation fan 3 is disposed in vapor-phase type heating apparatus casing 88 and is disposed on the route such as one end of circulation duct 2 so as to circulate the heated gas.

Heat transfer fluid feeder 4, heat transfer fluid tank 11, and heat transfer fluid supply source 11b are disposed outside vapor-phase type heating apparatus casing 88 and are connected to circulation duct 2 on the route so as to supply heat transfer fluid to circulation duct 2.

Heat transfer fluid tank 11 and heat transfer fluid supply source 11b function as an example of a heat transfer fluid supply device.

An example of a heated gas includes the atmosphere, that is, the air, specifically, the air including vapor of the heat transfer fluid. An example of the heat transfer fluid is a fluorinated inert fluid having an electrical insulation property.

For example, heating furnace 1 has a configuration in which housing 8 provided with multiple openings 8a, in which object 7 is accommodated, is disposed in the vicinity of the substantial center in the heating furnace. In the configuration, the heated gas is supplied from a right end portion in a lower portion of heating furnace 1, heats object 7 in housing 8, and then is discharged from upper end opening portion 8b of housing 8 in heating furnace 1. Details of housing 8 will be described below.

One end (for example, an upper end) of circulation duct 2 for circulating the heated gas is connected to heating furnace 1 on a downstream side (for example, an upper end portion of heating furnace 1 in FIG. 1). The other end (for example, a lower end) of circulation duct 2 is connected to heating furnace 1 on an upstream side (for example, the right end portion in the lower portion of heating furnace 1 in FIG. 1). Accordingly, the heated gas is caused to forcibly flow from the one end to the other end of circulation duct 2 by circulation fan 3, and thereby an air current is generated in the heated gas in heating furnace 1 from the upstream side toward the downstream side of heating furnace 1.

In addition, heater 5 as an example of a heat source is installed on the route of circulation duct 2, that is, on the downstream side from heat transfer fluid feeder 4. Heater 5 supplies heat energy to heated gas in heating furnace 1, which flows in circulation duct 2 and has a temperature decreased due to heat transfer to object 7, and the heated gas has a temperature rise to a desired temperature. Further, heater 5 also supplies heat energy equal to or higher than latent heat of vaporization to heat transfer fluid 6 supplied from heat transfer fluid feeder 4 so as to change the heat transfer fluid into vapor. Heater controller 5a is capable of performing heating control of heater 5. A heating temperature for the heated gas in heater 5 can be set as a set temperature for the heated gas by heater controller 5a. Heater 5 heats the heated gas to the set temperature for the heated gas under control performed by heater controller 5a, and the latent heat of vaporization is applied to the supplied heat transfer fluid. In this manner, it is possible to heat object 7 in heating furnace 1 to a desired temperature.

Heat transfer fluid supply source 11b is configured as a pump or the like connected to heat transfer fluid tank 11. Under control performed by heat transfer fluid tank controller 11a, heat transfer fluid supply source 11b is driven, supplies gas such as the air at predetermined pressure into heat transfer fluid tank 11, and supplies the heat transfer fluid in heat transfer fluid tank 11 at supply pressure thereof to heat transfer fluid feeder 4. Under control performed by heat transfer fluid tank controller 11a, a supply amount of the gas from heat transfer fluid supply source 11b to heat transfer fluid tank 11 is adjusted, and thereby it is possible to control a supply amount of the heat transfer fluid to heat transfer fluid feeder 4.

Heat transfer fluid feeder 4 is connected to circulation duct 2 on the route between circulation fan 3 and heater 5. Accordingly, droplets of heat transfer fluid 6 supplied from heat transfer fluid feeder 4 are vaporized to be changed into vapor in heater 5 and are mixed with the heated gas flowing in circulation duct 2. Here, in order to supply a desired amount of heat transfer fluid 6 in a droplet shape to circulation duct 2 from heat transfer fluid tank 11, heat transfer fluid supply source 11b and heat transfer fluid tank controller 11a are provided in heat transfer fluid feeder 4 and perform control of the supply amount.

When the heated gas flowing in circulation duct 2 and the vapor of vaporized heat transfer fluid 6 are mixed with each other, the temperature of the heated gas heated in circulation duct 2 by heater 5 is adjusted to a temperature equal to or higher than a boiling point of heat transfer fluid 6, in order to prevent the vapor of heat transfer fluid 6 supplied into heating furnace 1 from liquefying. The heated gas including the vapor of vaporized heat transfer fluid 6 in circulation duct 2 is blown from the other end of circulation duct 2 into heating furnace 1 in which object 7 is disposed.

Blowing of the heated gas into heating furnace 1 by circulation fan 3 is adjusted such that a collision speed of the heated gas with object 7 becomes a desired speed. In heating furnace 1, the heated gas containing the vapor of heat transfer fluid 6 collides with object 7, and thereby heat energy of the heated gas itself is also transmitted to object 7. However, the vapor contained in the heated gas comes into contact with object 7 and cools to liquefy, and thereby latent heat of condensation due to a phase change to liquefaction of the vapor is applied to object 7. Therefore, compared to a case of the only collision of the heated gas to object 7, it is possible to highly efficiently achieve the temperature rise of the temperature of object 7 due to a very high heat-transfer coefficient.

Here, in heating furnace 1, object 7 is enclosed by housing 8 provided with multiple fine openings 8a in each surfaces thereof in heating furnace 1 such that the heated gas containing the vapor of heat transfer fluid 6 is caused to come into even contact with object 7, and thereby the heated gas containing the vapor of heat transfer fluid 6 is blown to object 7 with substantially even blast speed from fine openings 8a. Housing 8 is configured to have a size larger than that of object 7 and to have any three-dimensional shape such as a rectangular parallelepiped or a circular cylinder such that object 7 can be accommodated inside the housing and it is possible to secure a gap between the housing and object 7. An upper end of housing 8 communicating with opening 1h at the center portion of an upper end of heating furnace 1 is provided with upper end opening portion 8b at the center thereof and is connected to the one end of circulation duct 2. Circulation fan 3 is disposed at the one end of circulation duct 2. Housing 8 functions as an example of a spray member that is disposed around object 7 in heating furnace 1 so as to substantially evenly spray the heated gas in heating furnace 1 to object 7. Opening 1g at the center portion of a lower end of heating furnace 1 is opposite to the center portion of an undersurface of housing 8 provided with multiple fine openings 8a.

The vapor comes into contact with object 7 in housing 8 of heating furnace 1, the vapor of heat transfer fluid 6, of which the latent heat of vaporization of the vapor is applied to object 7, liquefies on a front surface of object 7 through the phase change, and the liquefying fluid passes through openings 8a of housing 8 such that heat transfer fluid 6 falls from the front surface of object 7 as droplets toward the lower portion of heating furnace 1. The heated gas is blown to object 7 at a substantially even blast speed even on a bottom surface of housing 8; however, it is necessary to prevent liquefied heat transfer fluid 6 as droplets from blocking fine openings 8a of housing 8, at the same time. On the other hand, it is preferable that openings 8a have a diameter of about 3 mm or larger and 5 mm or smaller in order to cause the heated gas containing the vapor of heat transfer fluid 6 to come into even contact with object 7.

At this time, a part of heat transfer fluid 6 falling as droplets is re-vaporized with energy of the heated gas in heating furnace 1 having a temperature that is set to be equal to or higher than the boiling point. Further, in the exemplary embodiment, bottom surface heater 9 is installed to re-heat and vaporize heat transfer fluid 6 that has fallen down to the bottom surface of heating furnace 1 and to supply the vaporized heat transfer fluid as the vapor in the heated gas in heating furnace 1. Bottom surface heater 9 is installed on a bottom surface of vapor-phase type heating apparatus casing 88 below heating furnace 1 in circulation duct 2, at a position of the bottom surface opposite to opening 1g at the center portion of the lower end of heating furnace 1. Bottom surface heater 9 functions as an example of re-heating device. The heating control of bottom surface heater 9 can be performed by controller 40 to be described below; however, another heater controller may be provided to control the heating control.

Consequently, the vapor of heat transfer fluid 6 supplied by heat transfer fluid feeder 4 in a space, in which the heated gas formed by heating furnace 1 and circulation duct 2 circulates, is stably present in heating furnace 1, and a temperature of the heated gas by heater 5 and a concentration of the vapor contained in the heated gas are substantially maintained at a set temperature and a set concentration, respectively. In such a configuration, the heating performance in heating furnace 1 is maintained to be desired performance corresponding to object 7.

In this case, there is a possibility that a part of the vapor will come into contact with a wall surface of heating furnace 1, will liquefy, and cannot be re-vaporized without being guided to bottom surface heater 9. Further, there is a possibility that the heat transfer fluid will be carried out of the heating furnace along with object 7 when object 7 is unloaded, with liquefied heat transfer fluid 6 remaining in a recessed portion of object 7 or being attached to a wall surface of object 7. Therefore, an amount of loss of heat transfer fluid 6 (in other words, an amount of heat transfer fluid 6 collected by collecting device 41) from heating furnace 1 as described above is appropriately added and supplemented from a heat transfer fluid supply device into heating furnace 1.

As an example, the addition and supplement of the heat transfer fluid are performed by detecting a change in concentration of the heat transfer fluid contained in the heated gas that circulates in heating furnace 1. In a case where the amount of the heat transfer fluid contained in the heated gas changes due to any reason, the concentration of the vapor changes. In this respect, a change in concentration of the vapor is detected such that a change in concentration of the heat transfer fluid is detected. Specifically, as vapor concentration detecting device 90 that detects a concentration of the vapor, a device that detects a difference in transmittance by using an infrared ray having a wavelength with a high absorption rate or a device that detects a dew point by always sampling a part of the heated gas is considered. According to a result detected by vapor concentration detecting device 90, a predetermined amount of vapor is supplied to the circulation route or is discharged from the circulation route, and thereby it is possible to perform the addition and the supplement of the amount of heat transfer fluid 6 which is collected by collecting device 41. As an example, vapor concentration detecting device 90 may be disposed on the upstream side from heater 5 of circulation duct 2 in FIG. 1. However, the disposition of the device is not limited thereto, and the vapor concentration detecting device may be disposed at any position such as in the vicinity of upper end opening portion 8b of heating furnace 1 or on the downstream side from heater 5 in circulation duct 2. Information detected by vapor concentration detecting device 90 is input to controller 40 and is used for control of the other devices.

In addition, collecting device 41 includes at least pump 41a that supplies, to heat transfer fluid tank 11, the liquefied heat transfer fluid discharged due to its own weight without being re-vaporized so as to be collected. Pump 41a may cause heat transfer fluid 6 falling as droplets to the bottom surface of heating furnace 1 to be forcibly discharged from heating furnace 1. For example, an amount of the heat transfer fluid that is collected by collecting device 41 can be obtained by directly measuring the amount of the collected heat transfer fluid by flowmeter 41b or the like. Otherwise, it is possible to hold the collected heat transfer fluid in collecting tank 10, to measure a position of a fluid surface in collecting tank 10 by a fluid-level meter (not illustrated), and to detect the amount of the collected heat transfer fluid.

In addition, in order to supply the heat transfer fluid depending on the amount of the collected heat transfer fluid, the supply may be performed as follows, for example. First, a relational table or a relational expression between the amount of the collected heat transfer fluid and a supply amount of the heat transfer fluid is obtained in advance as relational information and is stored in an internal storage, the supply amount of the heat transfer fluid depending on the amount of the collected heat transfer fluid is calculated by calculator 41e of the collecting device, based on the relational information, an amount of heat depending on the calculated supply amount is calculated by calculator 41e, and controller 40 causes the calculated amount of heat to be applied to heat transfer fluid 6 from heater 5.

It is possible to increase or decrease the heating performance in heating furnace 1 so as to adjust the heating performance corresponding to object 7, by increasing and decreasing the supply amount of heat transfer fluid.

For example, when the heating performance is high, the amount of heat transfer fluid 6 to be supplied is increased, and the vapor concentration of heat transfer fluid 6 in the heated gas in heating furnace 1 is increased to a desired vapor concentration higher than a set concentration obtained by this time. In this manner, it is possible to increase the latent heat of vaporization that is applied to object 7 from the vapor.

Conversely, in order to decrease the heating performance in heating furnace 1, heat transfer fluid 6, which is produced after the vapor comes into contact with object 7, liquefies by applying the latent heat of vaporization from the vapor to object 7 through the phase change, and falls down as droplets to the bottom surface of heating furnace 1, may be stopped from being re-vaporized. In other words, vaporization is stopped by bottom surface heater 9, and thereby heat transfer fluid 6 that falls down as droplets is collected by collecting device 41 on collecting route 42 from discharge portion 1*d* in the bottom surface of heating furnace 1 and returns to heat transfer fluid tank 11 via collecting route 42. In this manner, it is possible to decrease an amount of vapor of heat transfer fluid 6 contained in the heated gas to a desired amount of vapor smaller than a set amount of vapor.

Consequently, it is possible to reduce the heating performance in heating furnace 1. In this case, in order to further suppress the vaporization of heat transfer fluid 6, capacity of heater 5 of the heated gas is also decreased, and the temperature of the heated gas is controlled to be equal to or lower than the boiling point of heat transfer fluid 6. In this manner, it is possible to further reduce the heating performance with respect to object 7.

In the exemplary embodiment, as illustrated in FIG. 1, the controller 40 is provided as necessary. Controller 40 is capable of controlling individually the set temperature of heater 5, an amount (concentration) of the vapor of heat transfer fluid 6 via heat transfer fluid tank controller 11*a*, a rotation speed of motor 3M of circulation fan 3, a heating temperature of bottom surface heater 9, or the like. For simplification of the drawings, controller 40 or the like is illustrated in only some of drawings such as FIG. 1 and is omitted in the other drawings.

In a vapor-phase type heating method performed by using the vapor-phase type heating apparatus having the configuration of the exemplary embodiment, when the vapor formed by heating heat transfer fluid 6 is supplied to heating furnace 1 via circulation duct 2, and object 7 is heated by using the latent heat of vaporization of the supplied vapor, the following operation is performed as an example.

In heating furnace 1, object 7 is heated with the heated gas containing the vapor of heat transfer fluid 6, the vapor comes into contact with object 7 and cools to liquefy. Then, after the latent heat of vaporization of the vapor is applied to object 7 through phase change, heat transfer fluid 6 falls as droplets from the front surface of object 7 to a lower portion of heating furnace 1, and heat transfer fluid 6 is collected in collecting tank 10.

In addition, the heated gas obtained after heating object 7 is discharged from heating furnace 1 to circulation duct 2. In circulation duct 2, the vapor of heat transfer fluid 6 is supplied from heat transfer fluid feeder 4 to the discharged heated gas, and the heated gas containing the vapor of vaporized heat transfer fluid 6 is re-supplied to heating furnace 1 from circulation duct 2.

The collection and the supply are controlled by controller 40, and thereby it is possible to maintain a predetermined amount of the vapor of heat transfer fluid 6 in heating furnace 1 or heating furnace 1 and circulation duct 2, and it is possible to perform even distribution of the vapor of heat transfer fluid 6 in heating furnace 1 such that object 7, which is disposed in heating furnace 1, is heated at a predetermined rate of temperature rise.

Figure 2A:
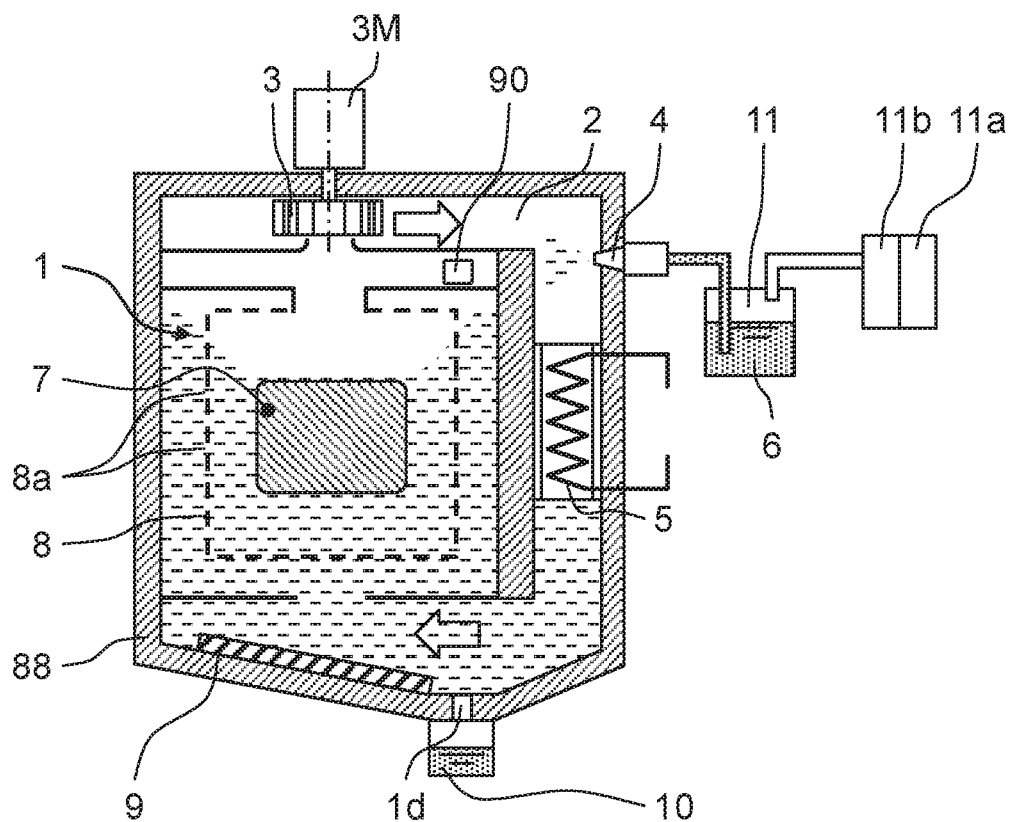
FIG. 2A is a diagram illustrating a state in which a vapor concentration is high in the vapor-phase type heating apparatus in the exemplary embodiment.
Figure 2B:
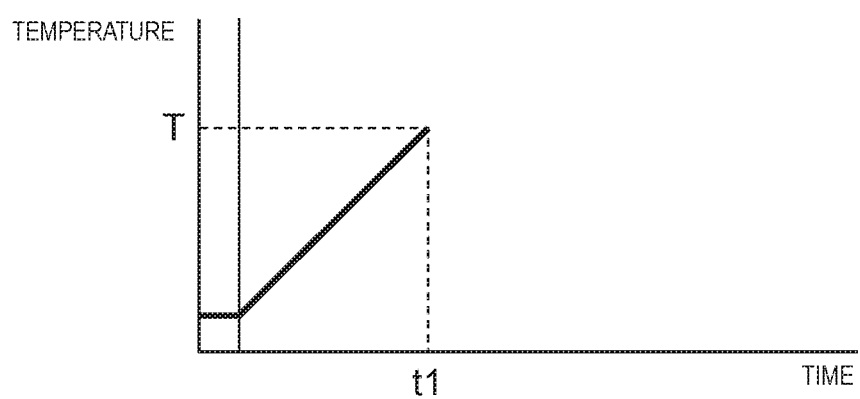
FIG. 2B is a graph illustrating a temperature profile in a configuration in FIG. 2A.
Figure 3A:
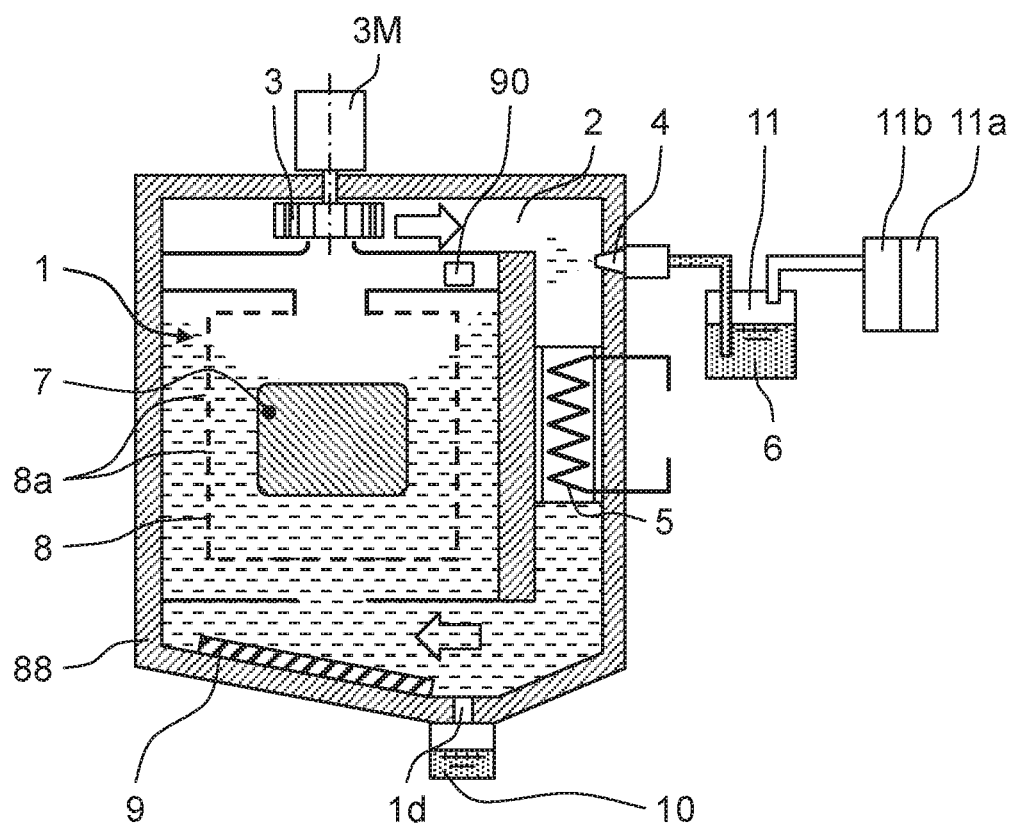
FIG. 3A is a diagram illustrating a state in which a vapor concentration is low in the vapor-phase type heating apparatus in the exemplary embodiment.
Figure 3B:
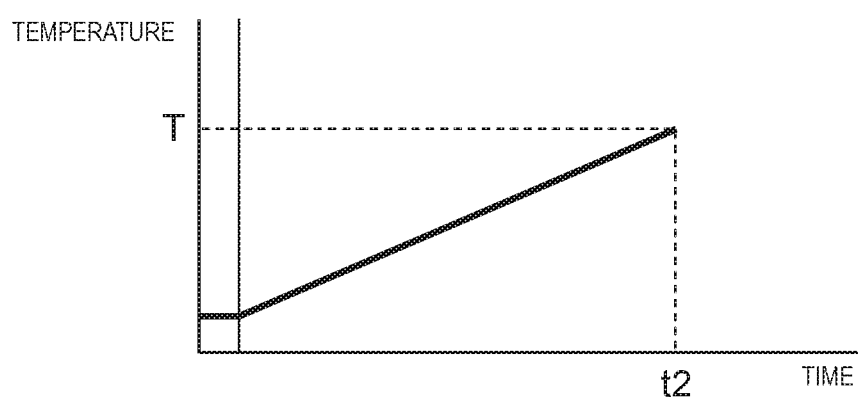
FIG. 3B is a graph illustrating a temperature profile in a configuration in FIG. 3A.

Here, FIGS. 2A and 3A are diagrams illustrating an influence of the vapor concentration of heat transfer fluid 6 in heating furnace 1 by the supply amount of heat transfer fluid 6 from heat transfer fluid feeder 4, in the exemplary embodiment of the disclosure. FIG. 2A illustrates a state in which the vapor concentration of heat transfer fluid 6 in the heated gas is high. FIG. 3A illustrates a state in which the vapor concentration of heat transfer fluid 6 in the heated gas is low. An intermediate transition state is present between the states in FIGS. 2A and 3A. In the state in FIG. 2A and the state in FIG. 3A, temperature rise performance is different in the states from each other as the heating performance is different in the states from each other, and rates of temperature rise of objects 7 in both cases are different from each other as illustrated in FIGS. 2B and 3B. However, even in both cases, in the temperature rise by the latent heat of vaporization, the object is not heated to have a temperature equal to or higher than the boiling point of heat transfer fluid 6, in principle. Therefore, the set temperature of the heated gas is set to be slightly higher than the boiling point, and thereby heating is not performed to a temperature equal to or higher than the boiling point temperature until the temperature of entire object 7 reaches the boiling point of heat transfer fluid 6. After the temperature of entire object 7 reaches the boiling point temperature of heat transfer fluid 6, the transition to the temperature rise is performed by the temperature of the heated gas; however, a heat-transfer coefficient due to the collision of the hot air is very small, compared to a heat-transfer coefficient due to the latent heat of vaporization. Therefore, there is little possibility of overheating to a temperature higher than necessary. The rate of temperature rise is rapid because the temperature reaches a predetermined temperature T at a period of time t1, in a case in FIG. 2A, and the rate of temperature rise is slow because the temperature reaches the predetermined temperature T at a period of time t2, in a case in FIG. 3A. Therefore, the temperature rises of the temperature profiles are obtained as illustrated in FIGS. 2B and 3B. Here, the period of time t2 is longer than the period of time t1.

Figure 4:
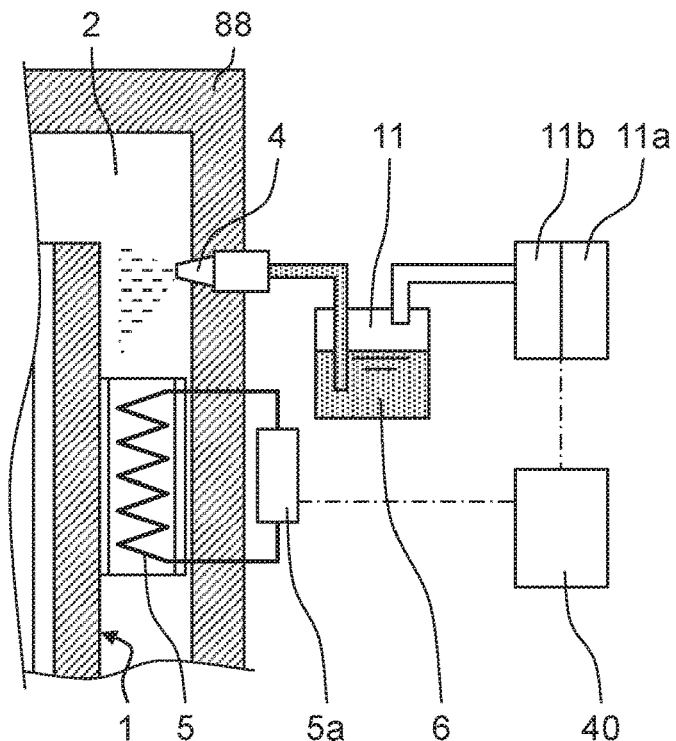
FIG. 4 is a diagram illustrating an adjustment of a vapor concentration by supply of heat transfer fluid in the vapor-phase type heating apparatus of the exemplary embodiment.

FIG. 4 is a diagram illustrating a heat transfer fluid supply method to circulation duct 2 from heat transfer fluid feeder 4 of heat transfer fluid 6 in the exemplary embodiment of the disclosure. A nozzle of a single-fluid type sprayer is used as an example of heat transfer fluid feeder 4 that supplies heat transfer fluid 6 to circulation duct 2, and it is possible to supply heat transfer fluid 6 as fine droplets. Consequently, it is possible to obtain a large contact area between heater 5 and heat transfer fluid 6, heat of heater 5 is more easily transmitted to droplets of heat transfer fluid 6, and the heat transfer fluid is likely to be vaporized. In addition, heat transfer fluid tank controller 11*a* controls driving of heat transfer fluid supply source 11*b* depending on the necessary supply amount of heat transfer fluid 6 which is controlled by controller 40 such that the supply amount or supply pressure of heat transfer fluid 6 from heat transfer fluid tank 11 to heat transfer fluid feeder 4 is determined and a desired amount of the vapor of heat transfer fluid 6 is supplied to circulation duct 2. Controller 40 controls heater controller 5a such that heater 5 applies the latent heat of vaporization for vaporizing droplets of heat transfer fluid 6 depending on the supply amount of supplied heat transfer fluid 6.

Figure 5:
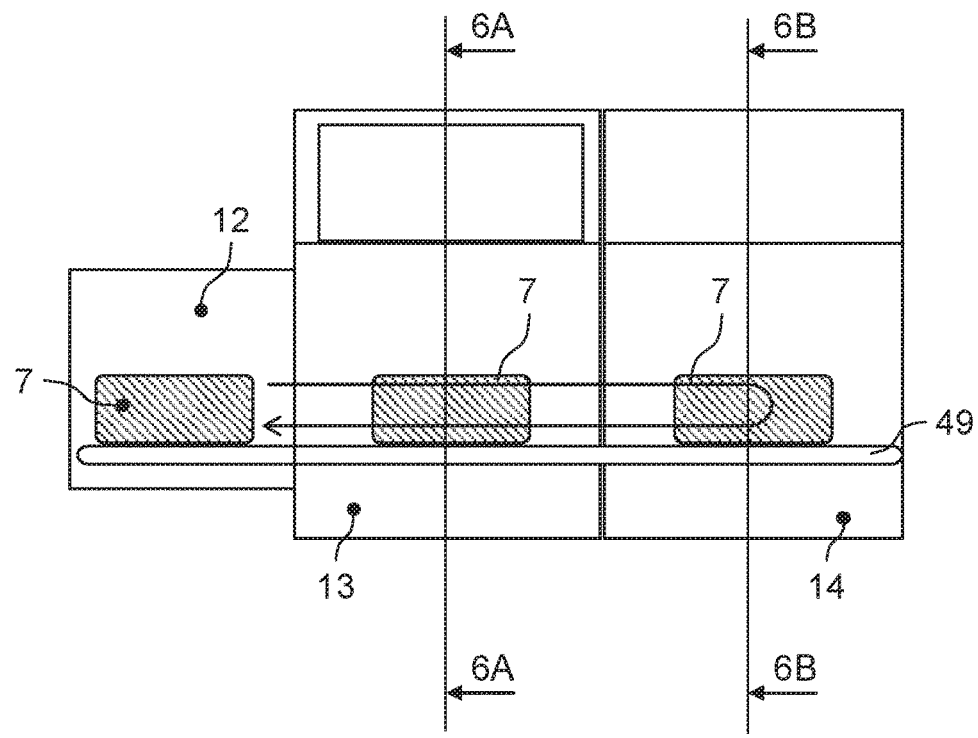
FIG. 5 is a diagram illustrating a vapor-phase type heating apparatus in a first modification example of the exemplary embodiment.

FIG. 5 is a diagram illustrating a vapor-phase type heating apparatus in a first modification example of the exemplary embodiment of the disclosure. The vapor-phase type heating apparatus is configured to have standby zone 12, temperature rise zone 13 having one side portion adjacent to standby zone 12, and temperature retaining zone 14 adjacent to the other side portion of temperature rise zone 13 of object 7.

Figure 6A:
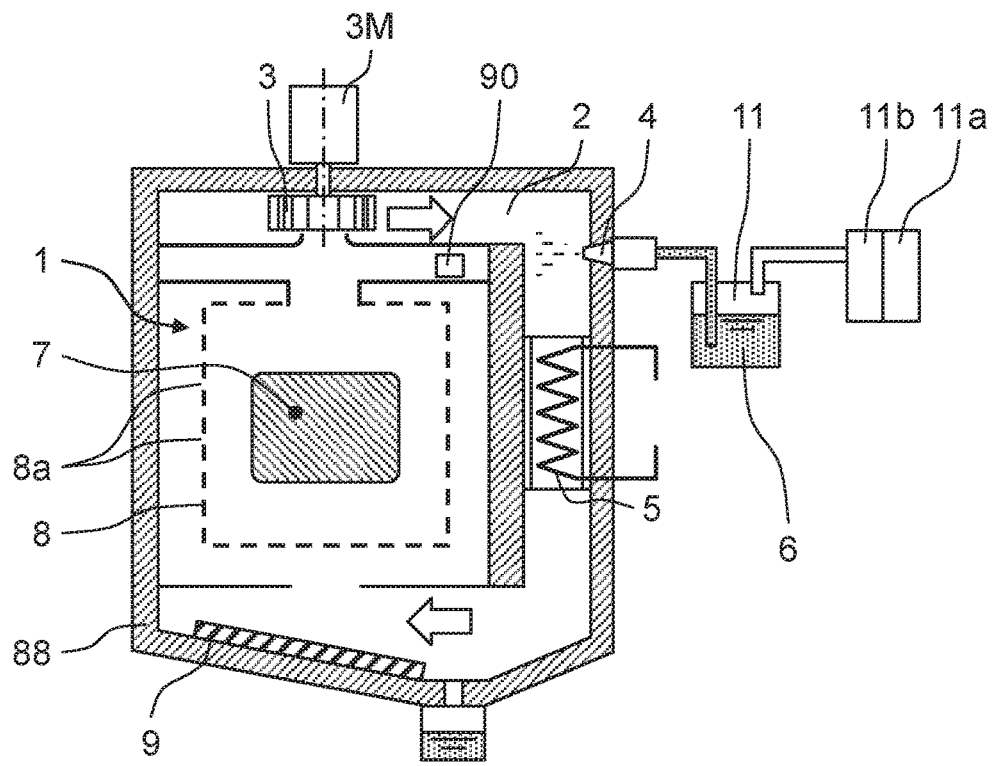
FIG. 6A is a sectional diagram of a temperature rise zone of the vapor-phase type heating apparatus in FIG. 5.
Figure 6B:
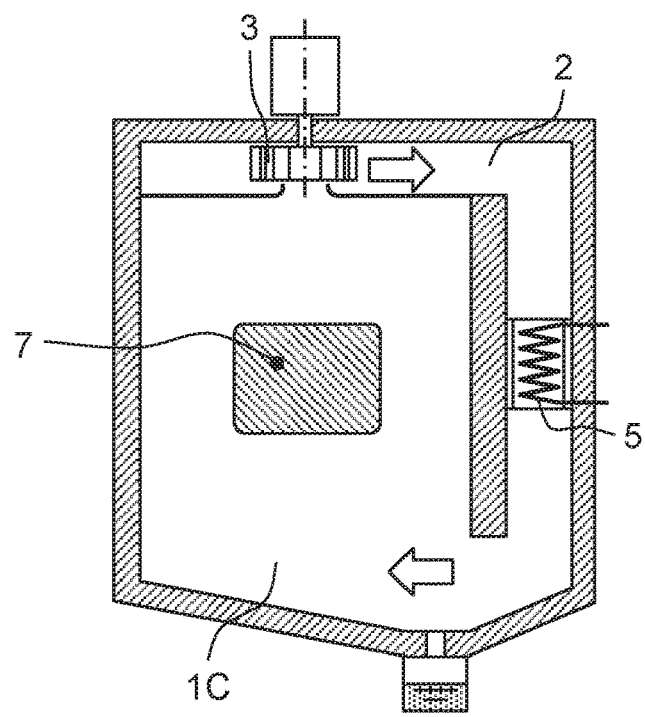
FIG. 6B is a sectional diagram of a temperature retaining zone of the vapor-phase type heating apparatus in FIG. 5.

FIG. 6A is a sectional view of temperature rise zone 13 in FIG. 5. FIG. 6B is a sectional view of temperature retaining zone 14 in FIG. 5. Conveyance device 49 like a conveyor belt is disposed over standby zone 12, temperature rise zone 13, and temperature retaining zone 14, and object 7 can be conveyed between the standby zone 12, temperature rise zone 13, and temperature retaining zone 14. As illustrated in FIG. 6A, temperature rise zone 13 is configured of the vapor-phase type heating apparatus in FIG. 1. As illustrated in FIG. 6B, temperature retaining zone 14 has a configuration in which circulation duct 2, in which heater 5 and circulation fan 3 are disposed, is connected to a lower end and an upper end of temperature retaining chamber 1C, instead of heating furnace 1 in the vapor-phase type heating apparatus in FIG. 1.

Figure 7:
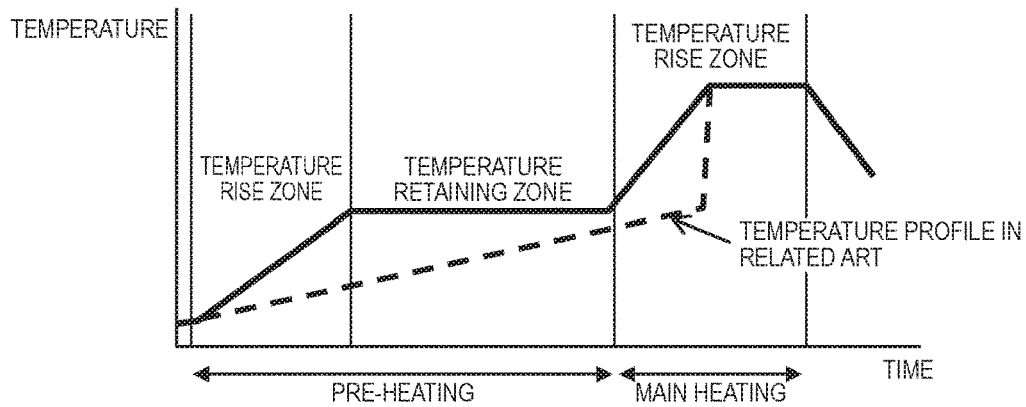
FIG. 7 is a graph illustrating a temperature profile of the vapor-phase type heating apparatus in the first modification example of the exemplary embodiment.

The configuration in FIG. 5 is a configuration for reproducing the temperature profile that needs multiple levels such as two or more levels of temperature rises such as a temperature profile illustrated in FIG. 7.

Object 7 is supplied from standby zone 12 to temperature rise zone 13, and object 7 is heated at a desired rate of temperature rise in temperature rise zone 13.

Subsequently, after the temperature of object 7 reaches the desired temperature in temperature rise zone 13, object 7 is carried from temperature rise zone 13 to temperature retaining zone 14, and object 7 is held at a constant temperature in temperature retaining zone 14.

Then, after object 7 remains in temperature retaining zone 14 for a desired period of time, object 7 is carried from temperature retaining zone 14 again to temperature rise zone 13 such that object 7 is heated at the desired rate of temperature rise in temperature rise zone 13.

Then, in a case of a temperature profile that needs two levels of temperature rises, object 7 is unloaded from temperature rise zone 13 to standby zone 12, and a series of heating treatment is completed.

Since object 7 may be held in temperature setting in a temperature retaining condition in temperature retaining zone 14 in FIG. 6B, there is no need to perform forcible heating, and there is no need to use a heating method in which the heat-transfer coefficient such as the latent heat of vaporization is high. In a case of the first modification example of the exemplary embodiment, a configuration of hot air circulation is employed, in which the temperature of the circulating heated gas is maintained to be constant, an air current of the heated gas is generated in temperature retaining chamber 1C by circulation fan 3, and the heated gas is blown to object 7 such that the temperature of object 7 is not decreased. At this time, heater 5 for maintaining the temperature of the heated gas at the predetermined temperature is disposed on circulation duct 2.

Figure 8:
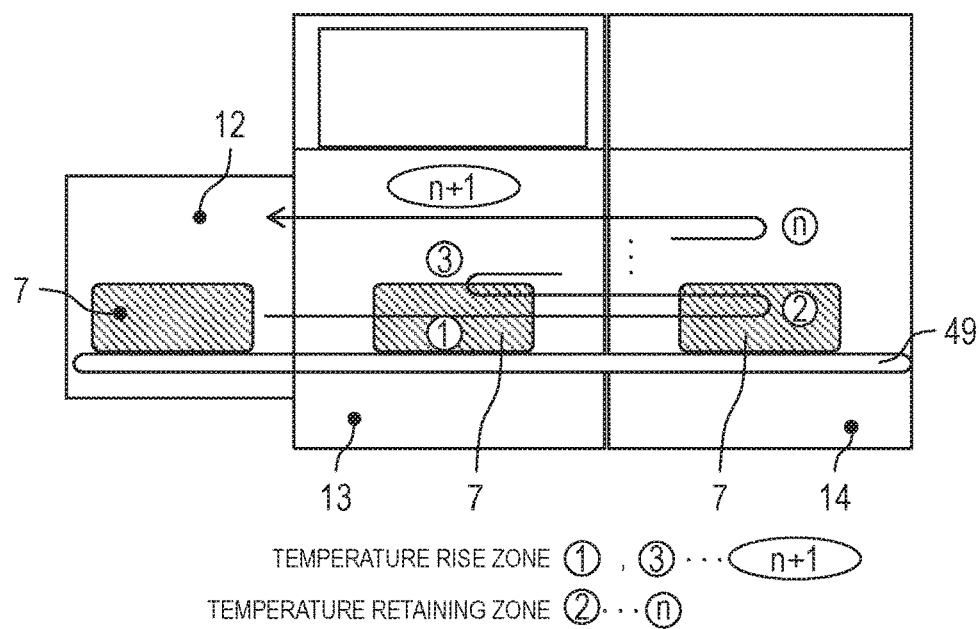
FIG. 8 is a diagram illustrating a vapor-phase type heating apparatus in a second modification example of the exemplary embodiment.
Figure 9:
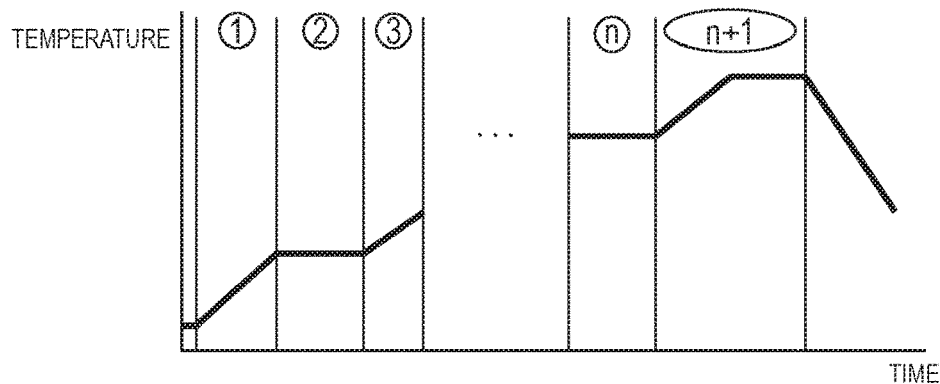
FIG. 9 is a graph illustrating a temperature profile in a configuration of the vapor-phase type heating apparatus in FIG. 8.
Figure 10:
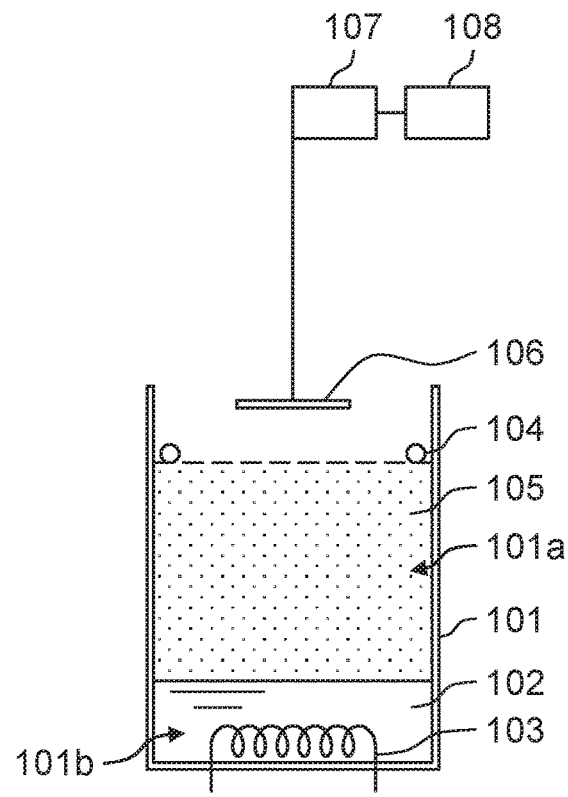
FIG. 10 is a diagram illustrating a vapor-phase type heating apparatus in the related art.
Figure 11:
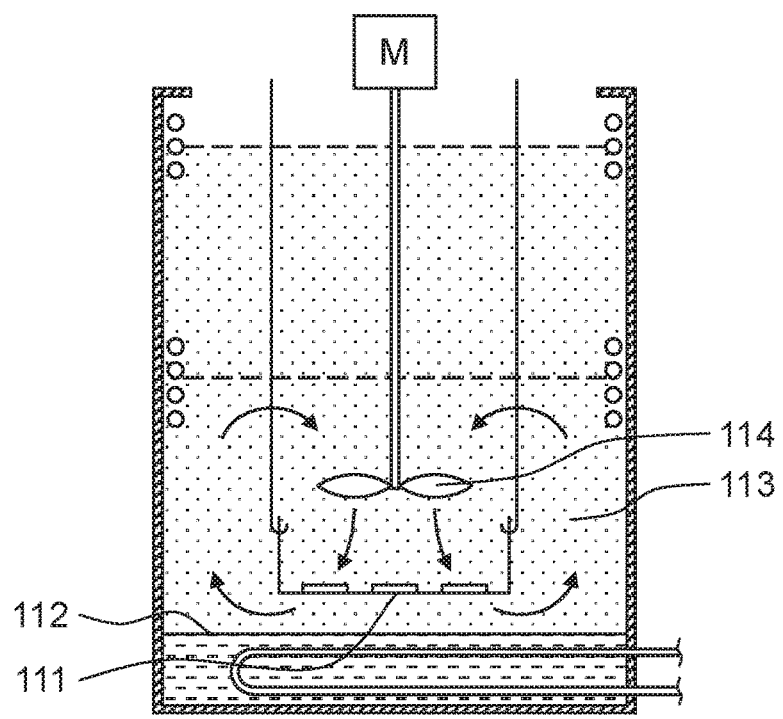
FIG. 11 is a diagram illustrating another vapor-phase type heating apparatus in the related art.

In addition, FIG. 8 illustrates a case where three or more of multiple levels of heating needs to be performed, as a second modification example of exemplary embodiment. After object 7 is heated in temperature rise zone 13, carrying of object 7 to temperature retaining zone 14 again is repeatedly performed, and thereby it is possible to perform multiple levels of temperature rise heating as illustrated in FIG. 9. Here, a case where heating in temperature rise zone 13 is performed (n+1) times, and the carrying of the object to temperature retaining zone 14 is performed n times is illustrated.

FIG. 7 is a graph illustrating a temperature profile obtained in a case of reflow soldering in the first modification example of the exemplary embodiment of the disclosure, in order to realize a general temperature profile, as an example, compared to a method in the related art. A solid line represents a general temperature profile obtained in a case of a reflow furnace that is used for soldering of a board on which electronic components are mounted in the first modification example. A dotted line represents a temperature profile obtained in a case of a reflow furnace in the vapor-phase type heating method in the related art. Pre-heating is performed by infrared heating or the like in a case of the reflow furnace of a vapor-phase type heating method in the related art, then, a board is put into the vapor of the heat transfer fluid for performing temperature rise to a soldering temperature, and rapid temperature rise is often performed at a constant rate of temperature rise. In the second modification example, in order to realize the general temperature profile, the heating is performed in a state in which the vapor concentration of heat transfer fluid 6 is adjusted such that the temperature rise for pre-heating is performed at the desired rate of temperature rise, the board is carried to temperature retaining zone 14 after the temperature reaches a pre-heating temperature, and the board is held at the pre-heating temperature for a predetermined period of time. Then, the board is again carried to temperature rise zone 13 for main heating, the temperature rise is again started, and the boiling point of heat transfer fluid 6 is set as a predetermined peak temperature of the board. As described above, the temperature of the board also rises to the boiling point of heat transfer fluid 6 and is maintained as it is. Then, the board is held at the peak temperature for a predetermined period of time such that the solder is sufficiently melted, wetted, and spread, and then the board is unloaded to standby zone 12. As described above, it is possible to realize the desired temperature profile.

According to the exemplary embodiment described above, heat transfer fluid 6 is supplied from heat transfer fluid feeder 4 and heat transfer fluid 6 is collected from heating furnace 1. In this manner, it is possible to maintain the predetermined amount of the vapor of heat transfer fluid 6 in heating furnace 1, and it is possible to heat object 7, which is disposed in heating furnace 1, at the predetermined rate of temperature rise in a state of the even distribution of the vapor of heat transfer fluid 6 in heating furnace 1. As a result, when the supply and the collection are adjusted, it is possible to increase or decrease the concentration and to achieve an even concentration of the vapor of heat transfer fluid 6 that transmits heat to object 7, it is possible to increase or decrease the rate of temperature rise, and it is also possible to perform even heating in three-dimensional object 7 with even heat transmission without an occurrence of a difference in heating performance depending on a position and a period of time during the heating of object 7.

When even heating of object 7 is considered, it is advantageous when a circulation air volume (air speed) is as high as possible; however, a collision air speed at which the component does not peel off is different depending on a shape of a component or a mounting method. Therefore, it is difficult to set the air speed uniformly; however, the collision air speed to object 7 can be about 1 m/sec at the maximum. When the heater temperature setting depends on the boiling point of the heat transfer fluid and further is controlled at predetermined saturated vapor pressure, the heater temperature setting often changes depending on a case of the vicinity of the temperature of boiling point, each time thereof, a temperature adjustment, or the like. However, it is possible to assume a set width of (about ½ of the boiling point) to (about 10° C. plus the boiling point) of the heat transfer fluid, as a changing width of temperature setting.

It is possible to achieve effects of exemplary embodiment or modification examples by appropriately combining any exemplary embodiment or any modification example of the embodiment or the various modification examples. In addition, it is possible to combine the exemplary embodiments with each other, to combine the examples with each other, or to combine the exemplary embodiments and the examples with each other, and it is possible to combine features with each other in different exemplary embodiments or examples.

As described above, according to the vapor-phase type heating method and the vapor-phase type heating apparatus of the disclosure, the supply of the droplets of heat transfer fluid and the collecting of the heat transfer fluid from the heating furnace enable the predetermined amount of the vapor of the heat transfer fluid to be maintained in the heating furnace and the object that is disposed in the heating furnace to be heated at the predetermined rate of temperature rise in a state of an even distribution of the vapor of the heat transfer fluid in the heating furnace. In addition, since it is possible to supply the heat transfer fluid as droplets, it is possible to obtain a large contact area between a heating device and the heat transfer fluid, heat of heating device is more easily transmitted to the droplets of heat transfer fluid, and the heat transfer fluid is likely to be vaporized. As a result, when the supply and the collection are adjusted, it is possible to increase or decrease the concentration and to achieve an even concentration of the vapor of the heat transfer fluid that transmits heat to the object, and it is possible to increase or decrease the rate of temperature rise. Therefore, it is also possible to perform even heating in the three-dimensional object with even heat transmission without an occurrence of a difference in heating performance depending on a position and a period of time during the heating of the object.

In the vapor-phase type heating method and the vapor-phase type heating apparatus of the disclosure, it is possible to increase or decrease to adjust the concentration and to achieve an even concentration of the vapor of the heat transfer fluid that transmits heat to the object, it is possible to increase or decrease the rate of temperature rise, and it is also possible to heat the object having a three-dimensional shape with even heat transmission without the occurrence of the difference in heating performance depending on the position and the time during the heating of the object. Therefore, aspects of the disclosure are a heating method and apparatus for uniformly heating the three-dimensional object and can be applied to a heating treatment method and apparatus such as a drying furnace, a cure furnace, or a reflow furnace for performing various types of heating treatment in a manufacturing process of an industrial product or a home appliance product or a manufacturing process of various types of electronic components.

What is claimed is:

1. A vapor-phase type heating method of supplying vapor of a heat transfer fluid to a heating furnace and heating an object by using latent heat of vaporization of the supplied vapor, the method comprising:
heating the object with a heated gas containing the vapor of the heat transfer fluid in the heating furnace;
collecting the heat transfer fluid falling from a front surface of the object to a lower portion of the heating furnace, after the vapor comes into contact with the object and cools to liquefy, and latent heat of vaporization of the vapor is applied to the object through phase change;
discharging the heated gas after heating the object from the heating furnace to a circulation route;
supplying the heat transfer fluid as droplets in the circulation route to an upstream side from a heat source that heats the heated gas;
then, heating the droplets so as to be changed into vapor and supplying the heated gas containing the vapor from the circulation route again to the heating furnace; and
maintaining a predetermined amount of the vapor of the heat transfer fluid in the heating furnace by the collecting and the supplying and heating the object which is disposed in the heating furnace at a predetermined rate of temperature rise in a state of an even distribution of the vapor of the heat transfer fluid in the heating furnace,
wherein the heat transfer fluid having liquefied, when the latent heat of vaporization of the vapor of the heat transfer fluid is applied to the object, is re-heated by using a re-heating device disposed in the heating furnace, by contacting the heated gas containing the vapor of the heat transfer fluid with the object that is disposed in the heating furnace in the heating furnace, and the heat transfer fluid is changed into vapor.

2. A vapor-phase type heating method of supplying vapor of a heat transfer fluid to a heating furnace and heating an object by using latent heat of vaporization of the supplied vapor, the method comprising:
heating the object with a heated gas containing the vapor of the heat transfer fluid in the heating furnace;
collecting the heat transfer fluid falling from a front surface of the object to a lower portion of the heating furnace, after the vapor comes into contact with the object and cools to liquefy, and latent heat of vaporization of the vapor is applied to the object through phase change;
discharging the heated gas after heating the object from the heating furnace to a circulation route;
supplying the heat transfer fluid as droplets in the circulation route to an upstream side from a heat source that heats the heated gas;
then, heating the droplets so as to be changed into vapor and supplying the heated gas containing the vapor from the circulation route again to the heating furnace; and
maintaining a predetermined amount of the vapor of the heat transfer fluid in the heating furnace by the collecting and the supplying and heating the object which is disposed in the heating furnace at a predetermined rate of temperature rise in a state of an even distribution of the vapor of the heat transfer fluid in the heating furnace,
wherein an amount of the vapor of the heat transfer fluid in the circulation route is adjusted by supplying the heat transfer fluid as droplets to the circulation route from a single-fluid type sprayer,
wherein an amount of the vapor of the heat transfer fluid in the circulation route is adjusted by supplying the heat transfer fluid as droplets to the circulation route from a single-fluid type sprayer, and
wherein the heat transfer fluid having liquefied, when the latent heat of vaporization of the vapor of the heat transfer fluid is applied to the object, is re-heated by using a re-heating device disposed in the heating furnace, by contacting the heated gas containing the vapor of the heat transfer fluid with the object that is disposed in the heating furnace in the heating furnace, and the heat transfer fluid is changed into vapor.

3. A vapor-phase type heating apparatus comprising:
a heating furnace that holds an object inside and causes heated gas containing vapor of heat transfer fluid to come into contact with the object such that the object is heated by using latent heat of vaporization of the vapor;
a circulation route that discharges the heated gas after heating the object from the heating furnace and supplies the heated gas again to the heating furnace;
a blower that is disposed on the circulation route and sends the heated gas toward the heating furnace;
a supply device that is disposed on the circulation route and supplies the heat transfer fluid as droplets into the circulation route;
a heating device that is disposed on a downstream side from the supply device on the circulation route, heats the heated gas discharged after heating the object from the heating furnace, and heats the droplets of the heat transfer fluid supplied from the supply device so as to change the droplets into vapor of the heat transfer fluid;
a collecting device that collects the heat transfer fluid in the heating furnace;
a controller that controls each of the supply device and the collecting device of the heat transfer fluid and controls a supply amount and a collecting amount of the vapor of the heat transfer fluid with respect to the circulation route so as to adjust the vapor in the heating furnace to a predetermined amount;
a spray member that is disposed around the object in the heating furnace and performs substantially evenly blow of the heated gas in the heating furnace to the object; and
a re-heating device that is disposed below the heating furnace and re-heats the heat transfer fluid, which liquefies on a front surface of the object and falls down as droplets to a side below the object, such that the heat transfer fluid is changed into vapor.

4. The vapor-phase type heating apparatus of claim 3, further comprising:
a single-fluid type sprayer that supplies the heat transfer fluid as the droplets to the circulation route and adjusts an amount of the vapor of the heat transfer fluid in the circulation route.

* * * * *